United States Patent [19]

Machida

[11] Patent Number: 4,848,536
[45] Date of Patent: Jul. 18, 1989

[54] APPARATUS FOR TRANSPORTING AN ELECTRICALLY CONDUCTIVE WAFER

[75] Inventor: Akira Machida, Kawasaki, Japan

[73] Assignee: Fujitsu Limited, Kawasaki, Japan

[21] Appl. No.: 174,737

[22] Filed: Mar. 29, 1988

[30] Foreign Application Priority Data

Mar. 31, 1987 [JP] Japan .................. 62-080368

[51] Int. Cl.$^4$ ............ B65G 35/00; B65G 47/24
[52] U.S. Cl. .................... 198/619; 198/381; 104/23.2
[58] Field of Search ............ 198/381, 619; 104/23.1, 104/23.2, 282, 284, 286, 290, 292, 293; 271/193, 267, 246, 18.1, 1; 406/86, 87, 88

[56] References Cited

U.S. PATENT DOCUMENTS

| | | | |
|---|---|---|---|
| 1,020,942 | 3/1912 | Bachelet ................. | 104/282 |
| 3,661,298 | 5/1972 | Ioffe et al. ............. | 198/381 |
| 3,692,168 | 9/1972 | Hughes, Jr. et al. ..... | 198/619 |
| 4,299,173 | 11/1981 | Arima et al. ............ | 104/293 |
| 4,624,617 | 11/1986 | Belna ................... | 198/619 |

FOREIGN PATENT DOCUMENTS

| | | | |
|---|---|---|---|
| 0643316 | 4/1937 | Fed. Rep. of Germany ...... | 104/284 |
| 0020586 | 2/1978 | Japan ................... | 406/88 |
| 0034272 | 3/1978 | Japan ................... | 198/619 |
| 0048520 | 3/1982 | Japan ................... | 198/619 |
| 0108264 | 7/1982 | Japan ................... | 406/88 |
| 0217434 | 9/1986 | Japan ................... | 406/88 |
| 2165515 | 4/1986 | United Kingdom ......... | 198/619 |

Primary Examiner—Andres Kashnikow
Assistant Examiner—Timothy Newholm
Attorney, Agent, or Firm—Armstrong, Nikaido, Marmelstein, Kubovcik & Murray

[57] ABSTRACT

A wafer transporter comprising a plurality of plane electrodes which are horizontally coplanar with each other. The plane electrodes face the wafer to be transported. A plurality of air nozzles are provided through the electrodes, and air is blown from the nozzles perpendicularly toward the wafer surface. A voltage is applied between the electrodes facing the wafer. The applied voltage is divided by the capacitances between the wafer which is electrically conductive, and the electrodes, thus the wafer is attracted vertically toward the electrode, and is maintained without friction by the balance of the repulsive force of the air blowing and the attractive electrostatic force. The divided voltages become unequal due to the difference of the wafer area facing respective electrodes. This voltage difference produces a horizontal force which moves the wafer in a horizontal direction. The wafer is forced to stay at a balancing point where the induced voltages are equal. This is used to prevent the wafer from deviating from the course. Successive switching of the applied voltage to a next electrode in the direction of the wafer's movement allows the wafer to travel along the row of the electrodes.

12 Claims, 10 Drawing Sheets

APPARATUS FOR TRANSPORTING AN ELECTRICALLY CONDUCTIVE WAFER

BACKGROUND OF THE INVENTION

1. Field of the Invention

This invention is related to an apparatus for transporting an electrically conductive material having the shape of a wafer by use of an electrostatic attractive force.

2. Description of the Related Art

There have been many types of carrying mechanisms employed for transporting a wafer, which is of relatively light weight, such as a semiconductor wafer. Some of the conventional transporters are shown in FIG. 1 through FIG. 5.

FIG. 1 shows a belt conveyer system where a wafer to be carried is placed on a belt which is driven by a motor and a drive mechanism.

FIG. 2 and 3 show a walking beam system where the beam makes a square motion like a fork lift, i.e., the beam moves in the direction of the arrow "a" to lift the wafer 6 sitting on a stage, then transports the wafer horizontally in the direction of the arrow "b", goes down in the direction of the arrow "c" and leaves the wafer on th stage and returns in the direction of the arrow "d" to the starting position.

FIG. 4 shows an air bearing system where an air jet is blown from a plurality of air nozzles provided in the stage by which the wafer is to be transported. The direction angle of the air jet is slanted so that the wafer floats as well as being driven toward the destination.

FIG. 5 shows a linear motor system where the wafer or a tray carrying the wafer thereon is magnetically driven by a linear motor.

Another system is a so-called electrostatic chuck, which is typically disclosed by Abe in unexamined patent publication Tokukai No. Sho 57-64950 in Japan and is composed of plural flat electrodes covered with a dielectric layer, with a high voltage applied between the electrodes. An electrostatic attractive force induced between the wafer and the electrodes by the applied voltage holds the wafer.

Problems of these conventional systems are as follows: In the systems of FIG. 1 through 3 and the electrostatic chuck, the surface of the wafer must contact a foreign material, such as the belt or the beam, etc., and the system becomes bulky. In FIG. 4 the edges of the electrodes must contact side walls (which are not shown in FIG. 4), by which the wafer is guided, i.e., is prevented from deviating from its direction. In FIG. 5 the wafer or a tray must be of a magnetic or electrically conductive material and the mechanism becomes complicated, because the semiconductor wafer, now in a major use, is not magnetic, nor sufficiently conductive. Furthermore, there are problems in that the mechanically moving parts are apt to cause dust or an impurity material which are harmful in semiconductor production. Machining of the slanted air bearing nozzles requires very sophisticated technique causing an increase of the cost of the production facilities. Furthermore, either of these conventional systems consumes a considerable amount of electric power.

SUMMARY OF THE INVENTION

It is a primarily object of the present invention to provide a wafer transporting system having no mechanically moving parts, which is therefore free from dust or harmful gas or deposition.

It is another object of the present invention to provide a wafer transporter system in which the wafer to be transported does not touch anything, and is therefore free from contamination thereon.

It is still another object of the present invention to provide a wafer transporter system which can transport a semiconductor wafer whose fabricated surface is facing down without touching anything but air.

It is further object of the present invention to provide a wafer transporter system which consumes little power.

According to the present invention, a wafer transporter comprises a plurality of plane electrodes arranged horizontally and coplanarly with each other so as to vertically face the wafer to be transported. A DC (direct current) voltage is applied between the electrodes so that the wafer, which is electrically conductive, is electrostatically attracted vertically toward the voltage-applied electrodes by an induced electric polarization charge on the wafer. The surfaces of the electrodes facing the wafer are provided with air nozzles through which air is blown to repel the wafer so as not to directly contact the electrodes. Therefore, an air gap between the wafer and the electrodes' surface is maintained by balancing the vertically attractive electrostatic force and the air repulsion force. An unbalance in the electrode area facing the wafer produces a horizontal electrostatic attractive force on the wafer. Because there is no friction between the wafer and the electrodes, the horizontal attractive force easily moves the wafer in a horizontal direction. If the wafer is to be continuously accelerated in the horizontal direction, the voltage applied is sequentially switched to a new electrode. Therefore, a horizontal wafer transporter is achieved without contacting anything but air, keeping the fabricated semiconductor surface downward, without requiring any movable mechanism and consuming little power. The electrode's surface may be coated with a dielectric layer to prevent direct contact between the wafer and the electrode.

The above mentioned features and advantages of the present invention, together with other objects and advantages, which will become apparent, will be more fully described hereinafter, with reference to the accompanying drawings forming a part hereof, wherein like numbers refer to like parts throughout.

BRIEF DESCRIPTION OF THE DRAWINGS

FIG. 8 ($b$) shows a simplified model configuration of the electrodes and the wafer for the theoretical analysis of the electrostatic attractive force of the present invention.

DETAILED DESCRIPTION OF THE PREFERRED EMBODIMENTS

Figure 1:
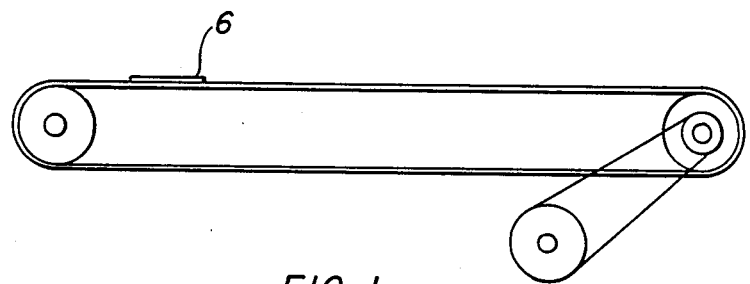
FIG. 1 schematically illustrates a side view of a prior art transporter system employing a belt conveyer.
Figure 2:
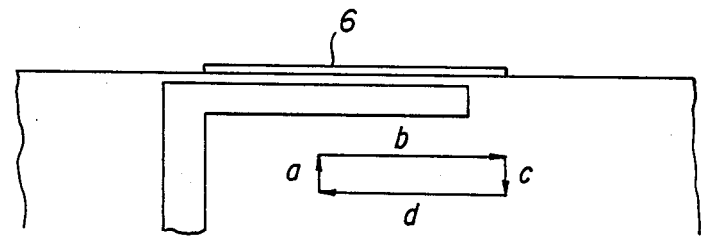
FIG. 2 schematically illustrates a side view of a prior art transporter system employing a walking beam.
Figure 3:
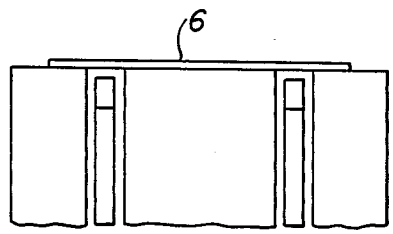
FIG. 3 schematically illustrates a plan view of the prior art transporter system of FIG. 2.
Figure 4:
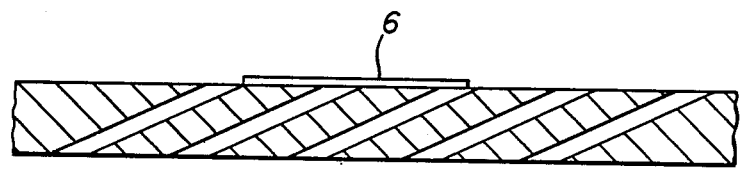
FIG. 4 schematically illustrates a side view of a prior art transporter system employing slanted air nozzles.
Figure 5:
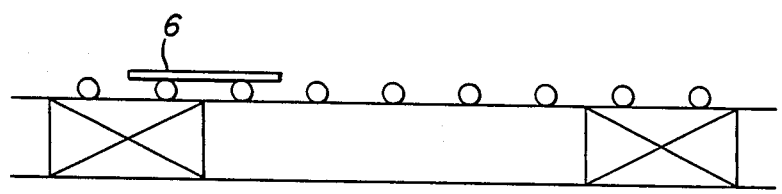
FIG. 5 schematically illustrates a prior art transporter system employing a magnetic linear motor.
Figure 6:
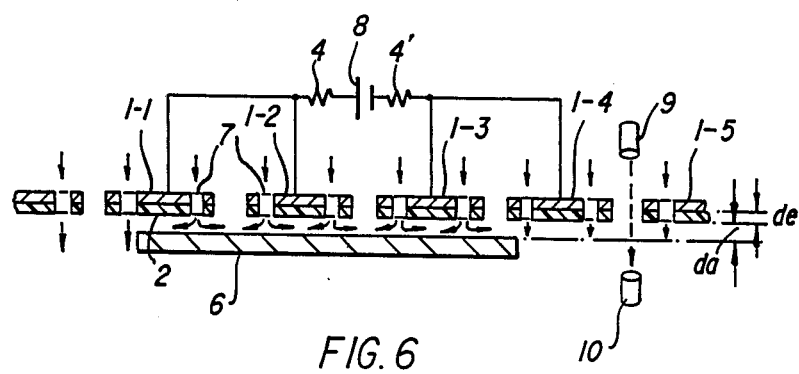
FIG. 6 schematically illustrates a sectional side view of an embodiment of the present invention.
Figure 7:
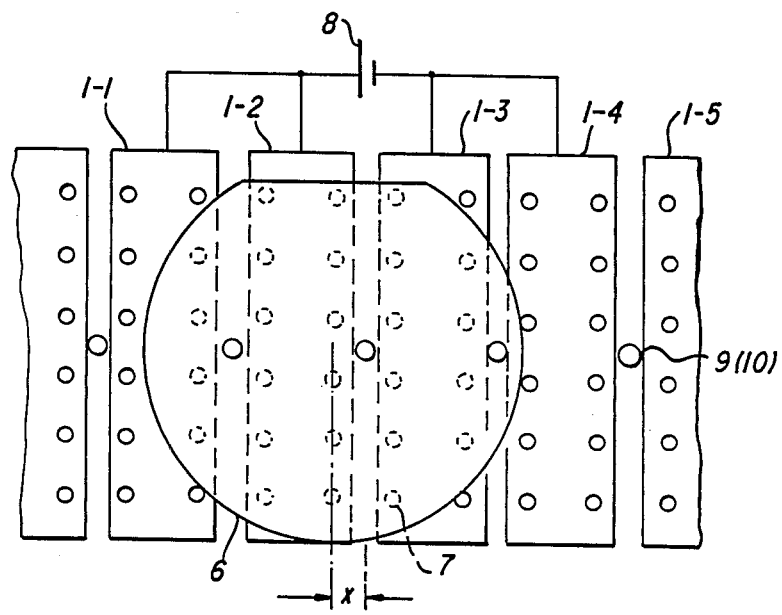
FIG. 7 schematically illustrates a plan view of an embodiment of the present invention shown in FIG. 6.
Figure 14:
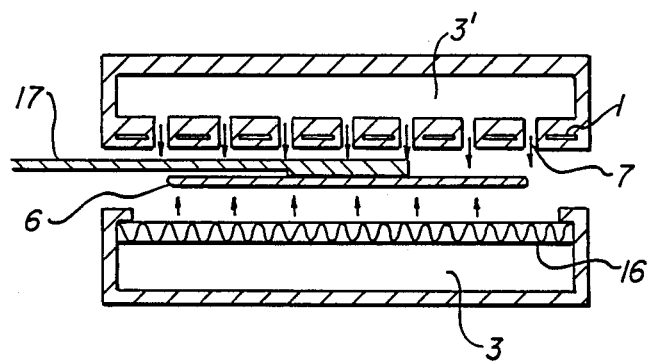
FIG. 14 shows a cross-sectional view orthogonal to the direction of the wafer transportation at a loading-/unloading stage.

Referring to FIG. 6 and 7, the principle of the present invention is hereinafter described. Plane electrodes 1-1 through 1-5 are provided horizontally coplanar with each other, in a transporter stage (not shown). A semiconductor wafer 6, which can be considered to be electrically conductive in this invention, is positioned to face the electrodes 1-1 through 1-4, and in this embodiment the wafer is positioned below the electrodes. The electrode surfaces facing the wafer are coated with a dielectric layer 2, such a alumina ceramic, as thick as 2.0 mm, for example. Air nozzles 7 extend through the electrodes as well as the dielectric layer 2. Air nozzles 7 blow clean dry air vertically and perpendicularly towards the wafer 6. The grid pitch of the nozzles is 10 to 20 mm, for example, for a 6 inch wafer. The blowing air is supplied through an air duct 3, (which is not shown in FIG. 6 and 7 but is shown in FIG. 14) into the nozzles 2. A positive DC voltage of 5,000 volts is applied preferably via a resistor 4 to the electrodes 1-1 and 1-2 from a DC power source 8, and the negative side of the DC voltage is applied preferably via a resistor 4' to the electrode 1-3 and 1-4.

Figure 8A:
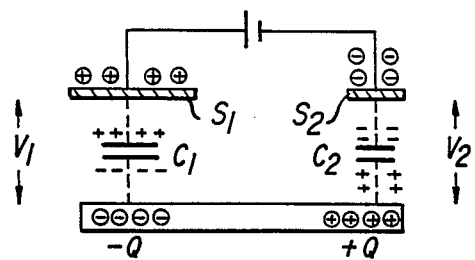
FIG. 8($a$) shows an equivalent electrical circuit diagram of the present invention.

The equivalent electrical circuit diagram of this state is shown in FIG. 8($a$), where $C_1$ shows an equivalent capacitance between the wafer and the electrodes 1-1 and 1-2, to which the positive terminal is connected and $C_2$ shows an equivalent capacitance between the wafer and the electrodes 1-3 and 1-4, to which the negative terminal is connected. The capacitance value of these capacitances $C_1$ and $C_2$ varies depending on the horizontal and vertical location of the wafer with respect to the electrodes. The DC voltage applied to the electrodes induces a polarized electric charge on the wafer as shown in FIG. 8, which consequently induces voltages $V_1$ across the capacitance $C_1$ and voltage $V_2$ across the capacitance $C_2$. In other words, the series circuit consisting of $C_1$ and $C_2$ divides the applied voltage into $V_1$ and $V_2$ via the wafer. These voltages $V_1$ and $V_2$ induced between the wafer and the electrodes, produce an electrostatic attractive force which pulls the wafer vertically toward the electrodes. However, the air blowing from the nozzle repulses or repels the wafer so as to prevent the wafer from contacting the electrodes. The gap between the electrodes and the wafer is determined as a result of the balance of the attractive force toward the electrodes and the repulsive force of the blowing air. Details of this balancing is explained later. Thus, the wafer can float in the air maintaining a proper distance from the electrodes, and accordingly there is no friction therebetween.

There is a general rule that $C_1V_1 = Q = C_2V_2$ because the induced Q is common for both of the capacitances $C_1$ and $C_2$, thus $V_1:V_2 = C_2:C_1$. $C_1$ is larger than $C_2$, and therefore, $V_1$ is less than $V_2$. The voltage difference between $V_2$ and $V_1$ produces a horizontal attractive force towards the higher voltage side, i.e., the right hand side in this example, as shown by the arrow F in FIG. 8($b$). Because there is no friction as mentioned above, the wafer is moved in the horizontal direction. When $C_1$ becomes equal to $C_2$, $V_2$ becomes equal to $V_1$, then the horizontally attractive force becomes zero. Thus, the wafer is always forced to move to the balance point where the areas $S_1$ and $S_2$ are equal, regardless of whether the polarity of x indicating the present location of the wafer is plus or minus.

Theoretical analysis of the attractive forces in detail is as follows: The capacitances $C_1$ and $C_2$ are formed with the areas $S_1$ and $S_2$ respectively. The thickness and the dielectric constant of the dielectric layer 2 are $d_e$ and $E_r$, respectively. The gap between the wafer and the surface of the dielectric layer 2 is $d_a$. Then, $C_1$ and $C_2$ are obtained as follows:

$$\frac{1}{C_1} = \frac{d_a}{E_0 S_1} + \frac{d_e}{E_r E_0 S_1}$$

$$\frac{1}{C_2} = \frac{d_a}{E_0 S_2} + \frac{d_e}{E_r E_0 S_2}$$

Therefore, the overall capacitance C, which is the load of the DC power source, is the series capacitance of $C_1$ and $C_2$ shown by the following formula:

$$\frac{1}{C} = \frac{1}{C_1} + \frac{1}{C_2} = \frac{E_r d_a + d_e}{E_r E_0} \cdot \left( \frac{1}{S_1} + \frac{1}{S_2} \right) \tag{1}$$

Now the overall electrostatic potential energy U is shown by the following formula, where V is the DC voltage applied from the power sources:

$$U = \tfrac{1}{2} C V^2 \tag{2}$$

On the other hand, as a general rule of dynamics, a force is induced in an amount as well as in a direction that the potential energy U is to become less. Each of the x, y and z components of the force are represented by the following formula, where x, y and z represent orthogonal horizontal and vertical directions respectively:

$$F(x) = -\frac{\partial U}{\partial x} \tag{3}$$

$$F(y) = -\frac{\partial U}{\partial y} \tag{4}$$

-continued $$F(z) = -\frac{\partial U}{\partial z} \quad (5)$$

The formulas (3), (4) and (5) are further reduced with the formulas (1) and (2) as follows:

$$F(x) = \frac{1}{2} \cdot Er \frac{Eo}{E_r d_a + d_e} \cdot V^2 \cdot \frac{d}{dx} \frac{S_1 S_2}{S_1 + S_2} \quad (6)$$

$$F(y) = \frac{1}{2} \cdot Er \frac{Eo}{E_r d_a + d_e} \cdot V^2 \cdot \frac{d}{dy} \frac{S_1 S_2}{S_1 + S_2} \quad (7)$$

$$F(z) = \frac{1}{2} \cdot \frac{E_r^2 Eo}{(E_r d_a + d_e)^2} \cdot V^2 \cdot \frac{S_1 S_2}{S_1 + S_2} \quad (8)$$

F(z) is a total force on areas $S_1$ and $S_2$ pulling the wafer towards the electrodes. F(x) and F(y) act as the forces to, move the wafer horizontally toward x and vertically toward and y directions respectively. In the example where the wafer is round as shown in FIG. 8 (b), where "x" is defined as a location of the center of the wafer measured from the border line of two electrodes to which the opposite polarities of the power source are applied to respectively, the calculation of the variable part of F(x) results in:

$$\frac{d}{dx} \frac{S_1 S_2}{S_1 + S_2} = -2 \sqrt{r^2 - x^2} + \quad (9)$$

$$\frac{4}{\pi r^2} \sqrt{r^2 - x^2} \left( r^2 \tan^{-1} \sqrt{\frac{r^2 - x^2}{x}} - x \sqrt{r^2 - x^2} \right)$$

Figure 8B:
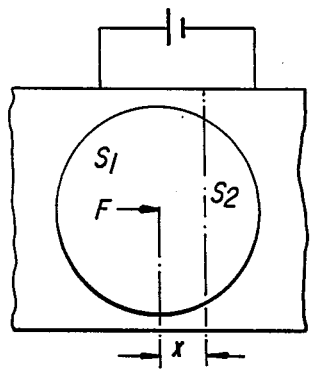
Figure 9:
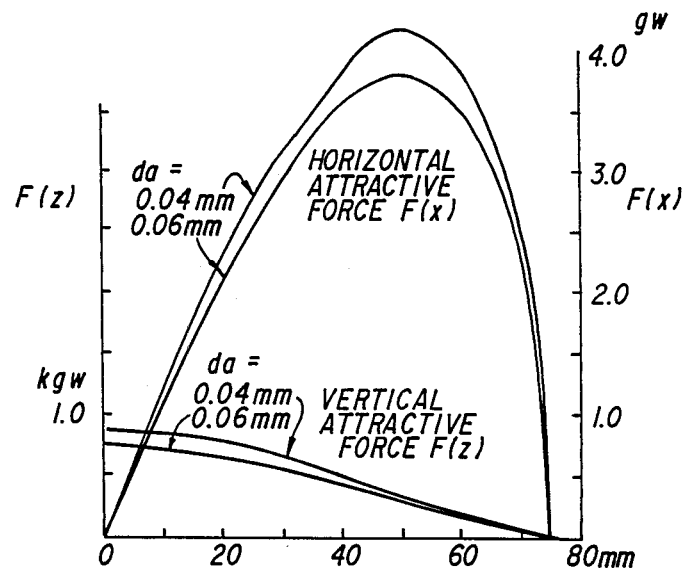
FIG. 9 shows the horizontal attractive force and the vertical attractive force as functions of the wafer location with respect to the electrodes.

The result of the quantitative analysis of a round wafer, having no orientation flat as shown in FIG. 8(b), on a horizontal attraction force and vertical attractive force are shown in FIG. 9, where:

| | |
|---|---|
| Radius of the wafer (6"dia.) | 75 mm |
| Width of the electrodes (W) | 16 cm |
| Pitch of the electrode along its direction (L) | 2 cm |
| Applied voltage from the power source | 5,000 V DC |
| The gap between the wafer and surface of dielectric layer on the electrode ($d_a$) | approx. 50 μm |
| Thickness of the dielectric layer ($d_e$) | 2.0 mm |
| Dielectric constant of the dielectric layer | 10 |

Figure 10:
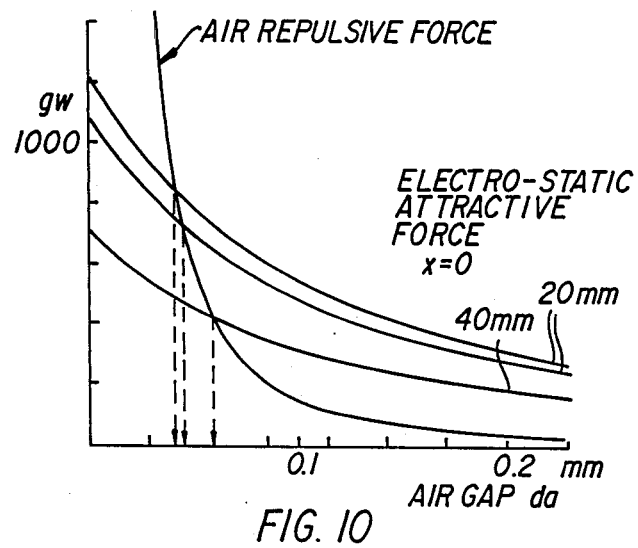
FIG. 10 shows the vertical attractive force and the repulsive force as functions of the air gap.

On the other hand, the repulsive force produced by the air blow is shown in FIG. 10 as a function of the air gap $d_a$, where:

| | |
|---|---|
| Diameter of nozzles | 1 mm |
| Pitch of a square grid of the nozzles | 20 mm |
| Total number of the nozzles facing the wafer | 44 |
| Velocity of the air being blown | 4.0 m/s |

The width of the air gap $d_a$ falls on the balancing point where the attractive force F(z), taken from FIG. 9, and Fp (the repulsive force Fr +the weight of the wafer) become equal as shown by an intersectional point of the two curves F(z) and Fp in FIG. 10. The repulsive force sharply decreases with the increase of the air gap $d_a$. The shape of these curves varies depending upon the value of the applied voltage, dielectric constant and the thickness of the dielectric coat, the velocity of the air being blown, the number of nozzles and the diameter of the nozzles. Consequently, the two curves can be designed so that they intersect each other at a proper air gap, 40 μm for x=0, 45 μm for x=20 mm and 60 μm for x=40 mm as seen in FIG. 10, at which conditions the horizontal acceleration is also properly achieved as is explained later. To simplify the explanation, the total attractive force on $S_1$ and $S_2$ is used for F(z), however, in the practical designation it must be considered that the vertical attractive force is not equal on the different areas $S_1$ and $S_2$.

From the results shown in FIG. 9 it is observed that in the range of x 20–40 mm, at least 2.2 gw (gram weight) of horizontal acceleration is obtained, while at least 450 gw of vertical attractive force is obtained.

When the wafer is required to be moved, i.e., to be accelerated, further in the case of FIG. 9, the voltage applied to the electrode must be switched, at the moment when x reaches approximately 20 mm, to a new electrode whose edge is then located at approximately 40 mm. Details of this switching will be described later.

As observed in FIG. 9, an average value of F(x) for the range x=20–40 mm is 3.0 gw. A semiconductor wafer of 6 inch diameter and 700 um thick, weighs approximately 30 grams. Therefore, this wafer is accelerated by 0.10 G (which is 3.0 divided by 30). Thus, after being accelerated along a 500 mm travel, the speed of the wafer reaches as high as 1.0 m/sec. After the wafer is once accelerated the wafer keeps on moving by its inertia without an external acceleration force, because there is no friction on the wafer. Therefore, when the wafer is to be stopped somewhere, the wafer must be decelerated. The principle of deceleration is the same as that of the acceleration except the direction of the horizontal attractive force is opposite. Transportation of the wafer for 500 mm distance, i.e., 250 mm acceleration and 250 mm deceleration, is achieved in 1.4 seconds.

Figure 11:
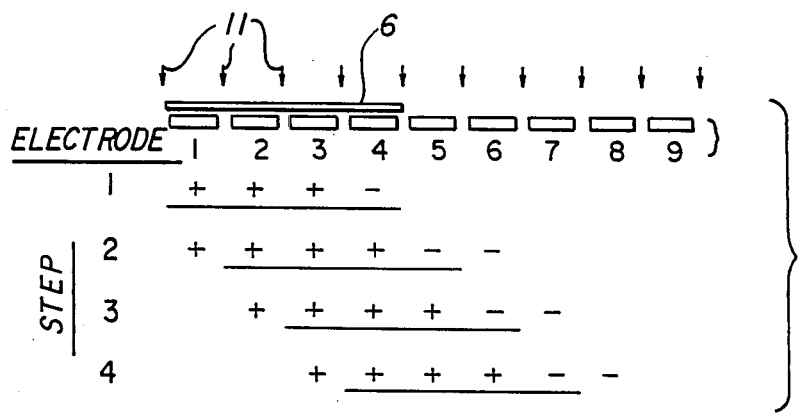
FIG. 11 schematically illustrates the switching sequence for applying a voltage to the electrodes for continuous acceleration.

Details of the switching of the voltage applied to the electrodes for continuous movement of the wafer is hereinafter described. FIG. 11 shows the manner of changing the applied voltage on each electrode as the wafer travels along the row of electrodes. The horizontal sequence in FIG. 11 indicates the numbering of the electrodes, and the vertical sequence indicates the advance of time by steps. During each step the wafer advances past a single electrode. To simplify the drawing the number of the electrodes simultaneously facing the wafer is chosen to be four in FIG. 11. The cross-sectional view of the wafer is at the initial position in which the wafer is facing the four electrodes 1 through 4. The "+" or "−" marks in FIG. 11 indicate the plus or minus voltage applied to the electrode existing there. The line beneath the "+" and "−" marks indicates the location of the wafer with respect to the electrodes at each step. The arrow marks indicate locations of position sensors, each of which is, in this example, a photocoupler. This photocoupler is composed of a photo diode 9 and a light detector 10 (FIG. 6). A light emitted from the photo diode 9 is received, and thus detected by the light detector 10. As is well known, the interception of light transmission in the photocoupler by the wafer induces an electrical signal indicating the existence of the wafer. In FIG. 11, the photocouplers, i.e., the position sensors, are located at the border lines of adjacent electrodes. A transition of the signal from the position sensor initiates switching the applied voltage. To simplify the drawing, only one set of the position detector 9 and 10 is shown in FIG. 6 as a representative of other position sensors 11 (not shown in FIG. 6 but shown in FIG. 7 located at each border line of the electrodes.

Figure 12:
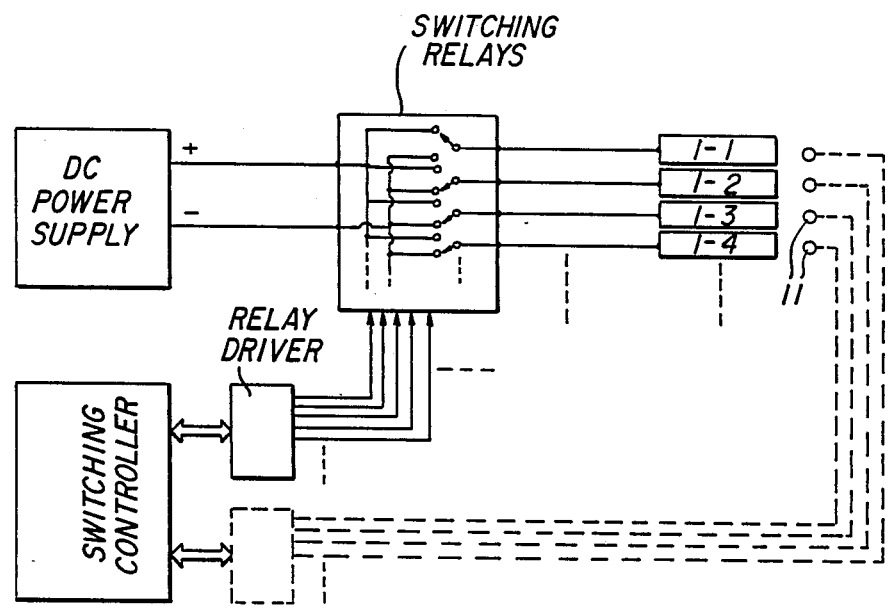
FIG. 12 schematically illustrates switching circuits for applying a voltage to the electrodes.

The switching circuit is schematically illustrated in FIG. 12. The switching is carried out according to a preprogrammed sequence provided by a switching controller including a microcomputer. Switching of each electrode is carried out by means of an electromechanical relay because of its high handling voltage. As described earlier, the wafer is always attracted in a direction in which side the quantity of the voltage-applied electrodes is less than that of the opposite side, accordingly in FIG. 11 the wafer is continuously accelerated toward tee right hand side. The position sensor 11 can be located at a position other than that of FIG. 6 and 7, depending upon the total design consideration. As described above, the switching, particularly the timing, of the electrodes on the front side of the wafer is essential, but the timing of the switching of the electrodes on the rear side is not so essential.

Figure 13:
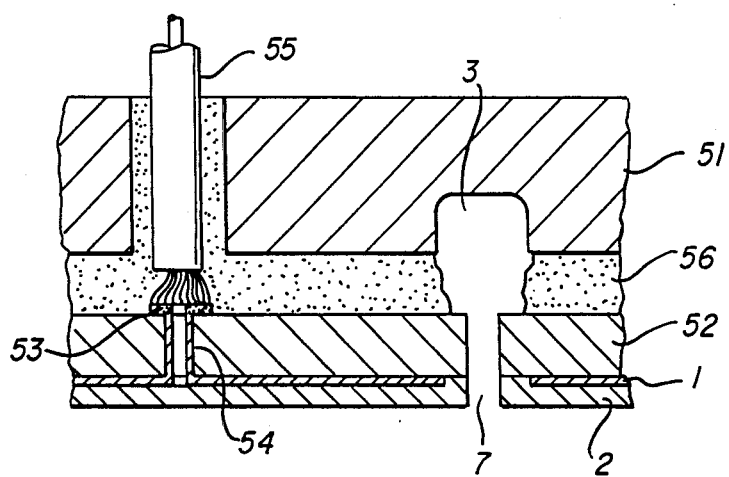
FIG. 13 shows a cross-sectional view of the structure of a typical wafer transporter according to the present invention.

A practical structure of the electrodes is shown in FIG. 13. A ceramic substrate 52, has air nozzles 7 therethrough. The electrodes 1 are patterned on one side of the substrate and wiring 53 is patterned on the other side. Through-holes 54 are formed to connect the patterns 1 and 53 using well known IC techniques. A dielectric layer 2 is coated on the electrodes as well as the ceramic surfaces. The wiring pattern 53 is connected to a cable 55, which is soldered to the pattern 53. The substrate 52 together with the cable is affixed to an aluminum base 51 by means of an adhesive 56, while an air duct 3 is formed behind the air nozzles 7.

A cross-sectional view of the system as an embodiment of the invention is shown in FIG. 14, which also shows an example of loading the wafer into the system of the invention, through an opening orthogonal to the direction of wafer transportation. An air filter 16 is provided beneath the course of wafer travel. The air filter 16 supplies clean air into the system and also functions to support the wafer if the wafer falls from the transporter. The wafer may be placed on the filter 16 by some means, such as the vacuum chuck 17 from a previous stage or conveyer, and then the air is blown through the filter 16 strongly enough to push the wafer up into a zone where the vertical attractive force of the electrodes 1 is effective.

Figure 15A:
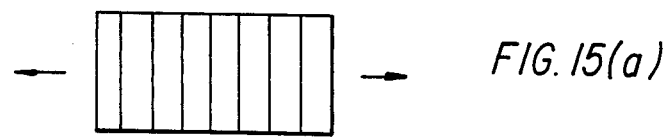
FIGS. 15($a$-$e$) schematically illustrate the variation of electrode configurations.
Figure 15B:
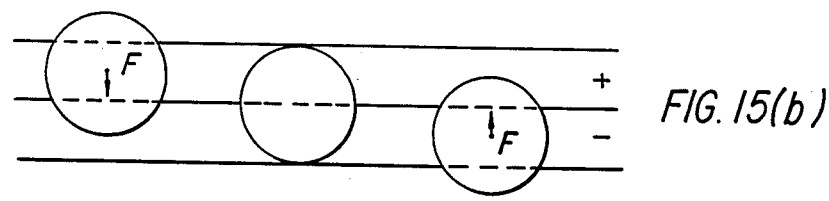
Figure 15C:
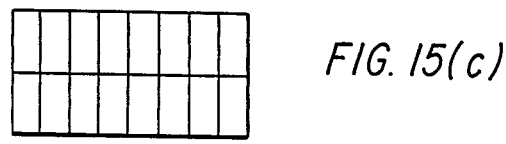
Figure 15D:
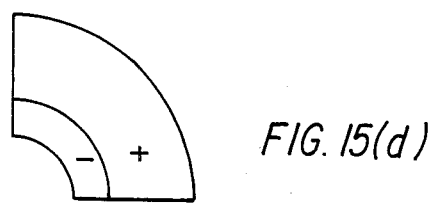
Figure 15E:
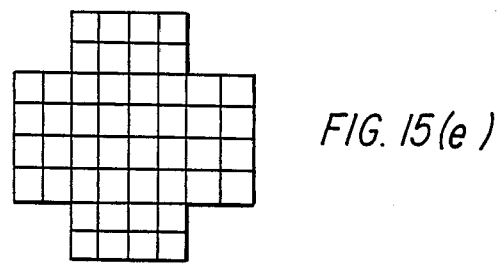
Figure 16:
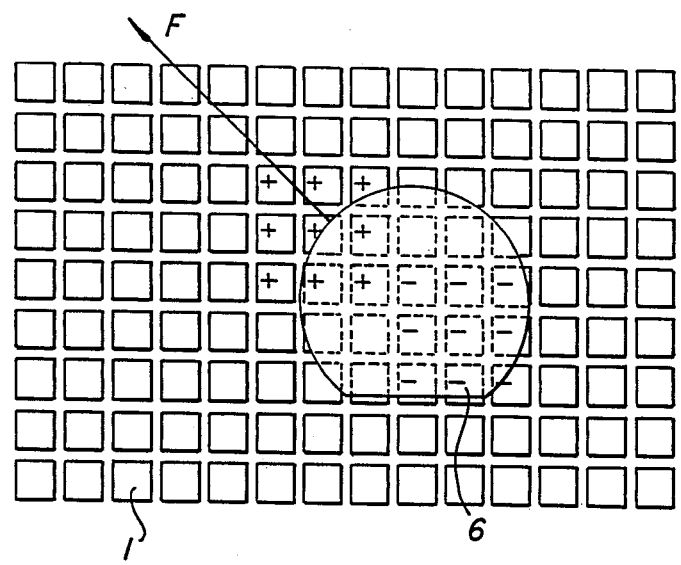
FIG. 16 shows an example of an applied voltage for moving the wafer in a diagonal direction.
Figure 17:
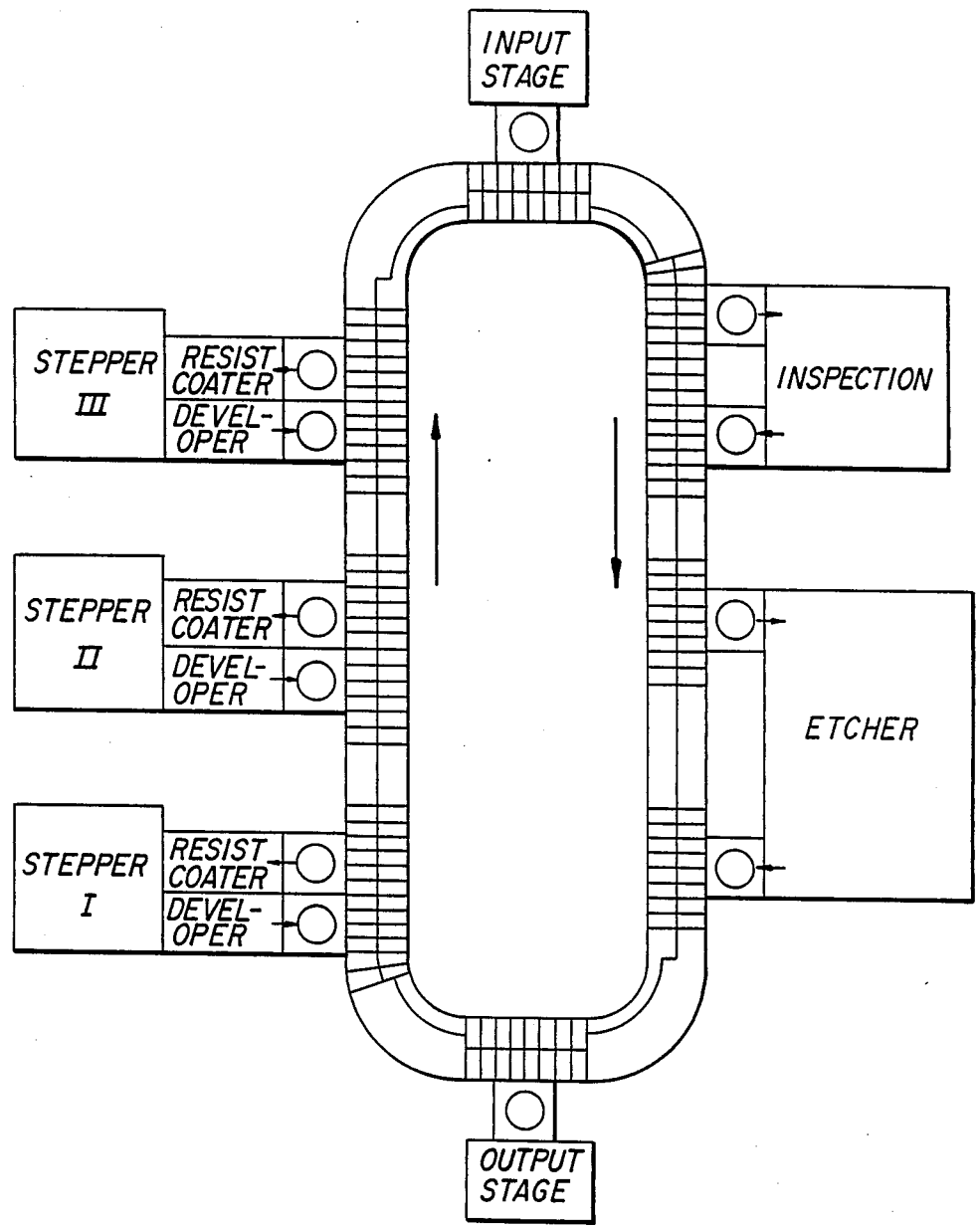
FIG. 17 schematically illustrates an example of the electrode layout in a semiconductor production system.

There can be many types of electrode configurations depending the particular purpose. Some of the typical electrode configurations are summarized in FIG. 15(a) through 15(e), where the arrows indicate the horizontal electrostatic force imposed onto the wafer by the invention. The electrode configuration in FIG. 15(a) where each rectangle represents a planar electrode 1-1, 1-2 and so on, is for linear acceleration, deceleration or holding of the wafer. In FIG. 15(b) the voltage is applied across two electrodes designated "+" and "−" respectively. The edges or border lines of the surfaces of the two plane electrodes "+" and "−" are provided along a center line of the desired course or direction of wafer transportation. Since no longitudinal acceleration or deceleration force is applied to the wafer by surface electrodes "+" and "−", the wafer continues to move or is transported longitudinally along the center line at a constant speed due to the inertia obtained as a result of acceleration by previous electrodes. Because of the lateral electrostatic attractive force applied by the electrodes "+" and "− ", that is, the electrostatic forces applied by the electrodes "+" and "−" are equal but of opposite sign, the two areas of the wafer facing the two electrodes are maintained equal by the same principal as described in FIG. 8 and this prevents the wafer from being laterally displaced or deviated relative to the center line of the desired direction of wafer transportation. FIG. 15(c) is a combination of FIG. 15(a) and (b) FIG. 15(d) is for a curved course, without any acceleration or deceleration toward the direction of the transportation, where the wafer is guided to maintain the curved travel course. This electrode configuration is a modification of FIG. 15(b) for use in a curved course or path of wafer transportation. The border line between the two electrodes "+" and "−" is shifted from the center line of the course, on which the wafer is being transported, towards the inner side of the curve to compensate for a centrifugal force resulting from the speed of the wafer applied by a previous electrode, because the horizontal attractive force generated by the smaller, inner electrode is stronger than that of the wider, outer electrode, as explained for FIG. 8. FIG. 15(e) is for orthogonally branching the course of wafer transportation. With the electrode configuration and the voltage application thereto shown in FIG. 16, an arbitrary direction of the wafer transportation, such as a diagonal direction indicated by the arrow F, can be chosen by designing the combination of the applied voltage on the electrodes as shown by the "+" and "−" marks denoting the positive and negative voltage application respectively thereto, and thus is applicable also for branching the course of the transportation. In the application of FIG. 15(b) and (d), unless the factors, such as the speed of the wafer at the entrance thereto, the weight of the wafer, the applied voltage, and the curvature of the curve, are carefully selected for determining the electrode configuration of the curved course, the wafer may move out of the course or laterally oscillate while traveling along the course. When the width A is larger than the width B in FIG. 15(d), the initial wafer speed at the entrance of the curved course can be chosen higher. An entire electrode layout for a typical wafer carrier system used for semiconductor wafer processing is shown in FIG. 17.

In the above-described system, the wafer is located below the electrodes, i.e., pulled up by the electrode, and the surface of the wafer on which semiconductor devices are already fabricated must face downward, i.e., the fabricated surface should not face the electrodes. The fabricated elements thereon can thus be protected from a high voltage electrical field induced thereon from the electrode voltage. This facing down posture is advantageous to avoid undesirable deposition of harmful particles thereon.

The total capacitance of the load on the applied DC voltage is, for example, 10 pf for a single switching, and accordingly the charging current, for example, 10 switchings per 0.5 sec, is as low as 2 $\mu$A. Therefore power consumption is of the order of 10 mW, which is negligibly small compared with that of the conventional systems.

Though in the above-described embodiment the wafer is in a position to be pulled up by the electrodes, it is clear that the wafer can be located above electrodes with surfaces facing upward and the air is blown upward as well. In this case, the air gap is, of course, determined by the balance of the repulsive force of the air blowing and the vertical attractive force plus the wafer's weight.

Although air is disclosed in the above-described embodiments as representative of a gas which may be blown through the nozzles, the gas may be an inert gas.

Though in the above-described embodiment the transported object is a semiconductor wafer, any other object can be transported by the system of the present invention, as long as the object is electrically conductive and it has a flat surface and is light in weight. The electrical conductivity of the wafer can be provided by a high resistive material, such as a silicon wafer for semiconductor production, because the charging current flowing through the wafer is very small thus the induced voltage drop across the wafer is negligibly small compared with the total supply voltage. An insulating material such as a ceramic substrate, can be transported by this system if its surface is coated with an electrically conductive material, such as copper layer.

Though in the above-described embodiments the voltage applied to the electrodes is a DC voltage having a particular polarity, the voltage polarization can be reversed, or may be replaced by an AC voltage as long as the voltage insulation, the attractive forces and the power consumption is allowable.

Figure 18:
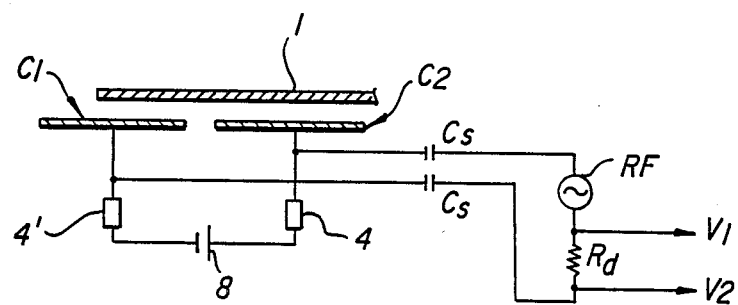
FIG. 18 shows the principle of a position sensor using a radio frequency.

Though in the above-described embodiment the position sensor is explained referring to a photocoupler, the position sensor may be of an RF (radio frequency) device, in which an RF signal voltage is applied between two electrodes as shown in FIG. 18 and also disclosed by Abe et al in unexamined patent publication No. Tokukai Sho 57-108246 in Japan. An Rf current flowing in the two electrodes increases when the wafer faces the two electrodes to which the voltage is applied. In FIG. 18, the resistors 4 and 4' are for blocking the RF current flowing into the power supply circuit. The resistors 4 and 4' may be replaced by inductive elements. The impedance of the resistors or the inductive elements must be high enough at the applied RF frequency compared with the impedance of the capacitance $C_1$ or $C_2$. In FIG. 18, the current is detected by measuring the voltage drop induced across a resistor Rd by the current flowing therethrough. Thus, an increased state of the RF current indicates the existence of the wafer, i.e., the wafer position.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

I claim as my invention:

1. An apparatus for transporting an electrically conductive wafer in a horizontal direction comprising:
   a plurality of plane electrodes, each of said electrodes having a horizontally extending planar surface coplanar with the planar surfaces of the other electrodes and facing the wafer;
   first means electrically connected to said electrodes, for selectively applying a voltage across at least two of said plane electrodes facing the wafer, such that the wafer is electrostatically attracted vertically toward the electrodes and accelerated horizontally; and
   second means for providing an air gap between the wafer and said plane electrodes.

2. An apparatus according to claim 1, wherein said second means comprises a plurality of gas nozzles extending through the surfaces of said plane electrodes, wherein a gas is blown through said nozzles towards the wafer.

3. An apparatus according to claim 2, wherein said gas is selected from a group consisting of an inert gas and clean, dry air.

4. An apparatus according to claim 1, wherein said surfaces of said plane electrodes are covered with a dielectric layer.

5. An apparatus according to claim 1, wherein said voltage applied to said electrodes is a DC (direct current) voltage.

6. An apparatus according to claim 1, wherein the number of said plurality of plane electrodes to which said voltage is applied is at least three adjacent plane electrodes a first area of said wafer adjacent an edge of said wafer is disposed opposite a first group of said adjacent plane electrodes consisting of at least one plane electrode, a remaining area of said wafer is disposed opposite other plane electrodes, and said applied voltage is sequentially switched from one to the next adjacent electrode depending upon location of the wafer to maintain said first area of said wafer less than said remaining area of said wafer, whereby said wafer is accelerated horizontally with said edge of said wafer serving as a leading edge of the accelerated wafer.

7. An apparatus according to claim 6 further comprising:
   third means for detecting location of the wafer longitudinally with respect to the course on which the wafer is being transported by said plane electrodes, whereby the switching of the applied voltage to said electrodes is effected according to the detected wafer location.

8. An apparatus according to claim 7, wherein said third means comprises:
   means for applying a radio frequency voltage between a particular pair of said plane electrodes; and
   means for detecting a radio frequency current flowing into a particular one of said plane electrodes;
   whereby an increase of said radio frequency current indicates that the wafer is facing said particular electrodes.

9. An apparatus according to claim 7, wherein said third means comprises:
   light emitting means located on one side of the wafer for emitting a light, and
   light detecting means for detecting the light emitted from said light emitting means, said light detecting means being located on an opposite side of the wafer from said light emitting means, said light emitting and detecting means being positioned such that said emitted light is intercepted by said wafer.

10. An apparatus according to claim 1, wherein said plurality of plane electrodes to which said voltage is applied is at least two plane electrodes with their planar surfaces located on opposite sides of and contiguous to a common borderline which extends in an intended direction of wafer transportation and said two electrodes guide the wafer along said intended direction of transporting the wafer.

11. An apparatus according to claim 10, wherein said borderline of said planar surfaces of said plane electrodes essentially extends along a center line of a course on which the wafer is being transported, whereby the wafer is transported along said borderline by an inertia previously provided when the wafer was accelerated by other electrodes and the wafer is essentially prevented from being laterally deviated from said course of transportation by said two plane electrodes.

12. An apparatus according to claim 10, wherein said common borderline between said planar surfaces of said two plane electrodes deviates from a center line of a course on which the wafer is being transported where said course is curved, said deviation being toward an inner side of said curve, whereby a centrifugal force resulting from the speed of the wafer previously provided by other electrodes is compensated for such that the wafer follows the curved direction of said curved course on which the wafer is being transported.

* * * * *